US007683462B2

(12) United States Patent
Chiou et al.

(10) Patent No.: US 7,683,462 B2
(45) Date of Patent: Mar. 23, 2010

(54) CHIP PACKAGE STRUCTURE

(75) Inventors: Jie-Hung Chiou, Shanghai (CN); Yong-Chao Qiao, Shanghai (CN); Yan-Yi Wu, Shanghai (CN)

(73) Assignee: ChipMOS Technologies (Bermuda) Ltd., Bermuda (BM)

( * ) Notice: Subject to any disclaimer, the term of this patent is extended or adjusted under 35 U.S.C. 154(b) by 0 days.

(21) Appl. No.: 11/734,250

(22) Filed: Apr. 11, 2007

(65) Prior Publication Data
US 2008/0185697 A1 Aug. 7, 2008

(30) Foreign Application Priority Data
Feb. 6, 2007 (CN) ......................... 2007 1 0001894

(51) Int. Cl.
*H01L 23/495* (2006.01)
(52) U.S. Cl. ........................................ 257/666; 438/123
(58) Field of Classification Search ................. 257/790, 257/676, E23.126, 666, 787, E21.51, E21.502, 257/E21.506, E23.031; 438/123
See application file for complete search history.

(56) References Cited
U.S. PATENT DOCUMENTS
4,769,344 A * 9/1988 Sakai et al. .................... 29/827

5,192,995 A * 3/1993 Yamazaki et al. ............. 257/787
6,281,568 B1 * 8/2001 Glenn et al. .................. 257/684
6,437,427 B1 * 8/2002 Choi ........................... 257/666
2004/0011699 A1 * 1/2004 Park ............................ 206/710
2005/0017330 A1 * 1/2005 Diot et al. .................... 257/666

FOREIGN PATENT DOCUMENTS
CN 1722423 1/2006

OTHER PUBLICATIONS
"1st Office Action of China counterpart application", issued on May 8, 2009, p. 1-p. 4.

* cited by examiner

*Primary Examiner*—Lynne A. Gurley
*Assistant Examiner*—Meiya Li
(74) *Attorney, Agent, or Firm*—Jianq Chyun IP Office (57) ABSTRACT

A method of fabricating a chip package structure includes the steps of providing a lead frame having a die pad, plural leads and at least one structure enhancement element. A chip is then disposed on the die pad and plural bonding wires are formed to electrically connect the chip to the leads. Then, an upper encapsulant and a first lower encapsulant are formed on an upper surface and a lower surface of the lead frame, respectively. The first lower encapsulant has plural concaves to expose the structure enhancement element. Finally, the structure enhancement element is etched with use of the first lower encapsulant as an etching mask until the die pad and one of the leads connected by the structure enhancement element, or two of the adjacent leads connected thereby are electrically insulated.

2 Claims, 8 Drawing Sheets

CHIP PACKAGE STRUCTURE

CROSS-REFERENCE TO RELATED APPLICATION

This application claims the priority benefit of P.R.C. application serial no. 200710001894.6, filed Feb. 6, 2007. All disclosure of the P.R.C. application is incorporated herein by reference.

BACKGROUND OF THE INVENTION

1. Field of the Invention

The present invention relates to a chip package structure. More particularly, the present invention relates to a chip package structure with a lead frame.

2. Description of Related Art

The production of integrated circuit (IC) devices is mainly divided into three stages including IC design, IC process and IC package.

In the stage of IC package, a bare chip is obtained via wafer production, circuit design, photomask formation and wafer sawing. Each bare chip obtained by sawing the wafer is electrically connected to a substrate via bonding pads formed on the chip. A molding compound then encapsulates the bare chip to protect it from being adversely affected by external moisture and being polluted by dusts. Moreover, an electric interconnect between the bare chip and an external circuit is maintained. A chip package structure is thus constructed.

Figure 1:
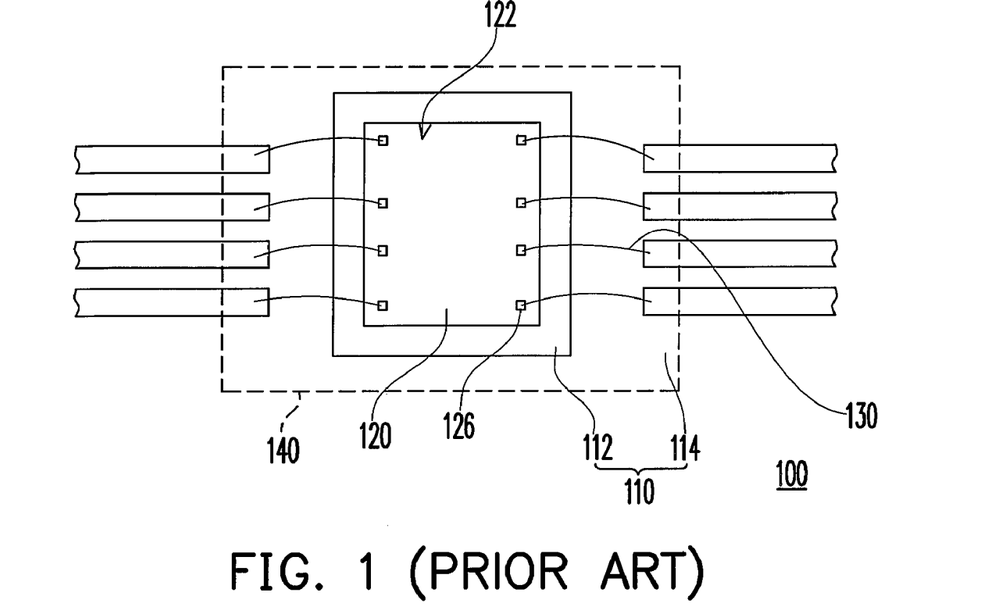
FIG. 1 is a schematic top view depicting a conventional chip package.
Figure 2:
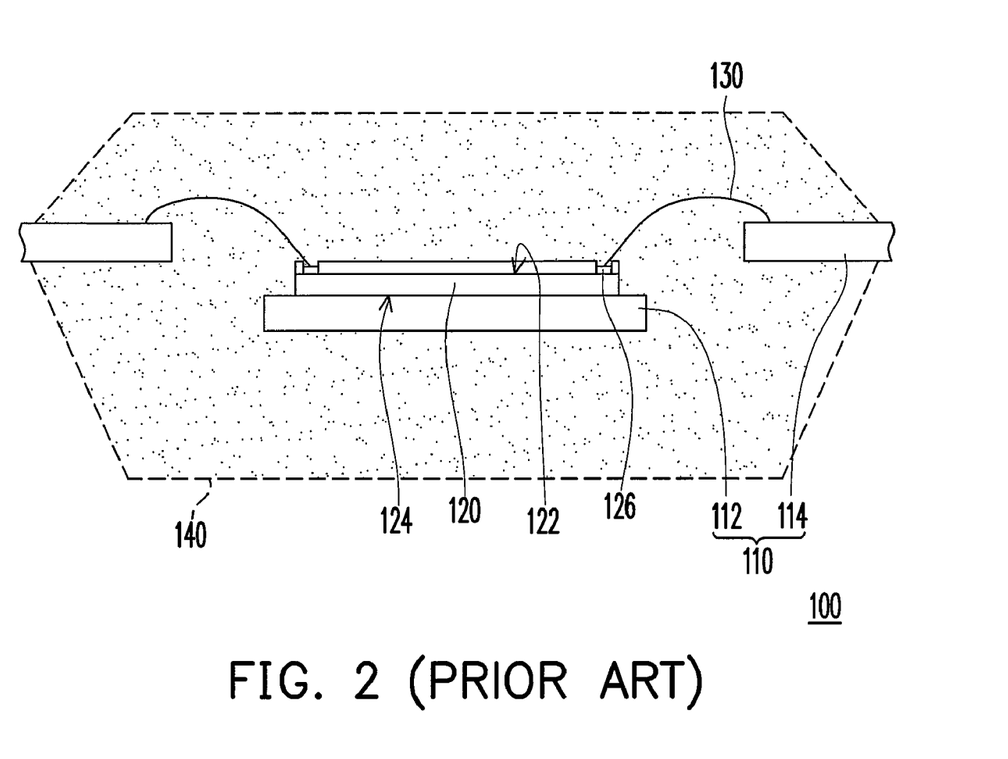
FIG. 2 is a schematic cross-sectional view depicting the chip package of FIG. 1.

FIGS. 1A and 1B are respectively a top view and a cross-sectional view of a conventional chip package structure. A chip package 100 includes a lead frame 110, a chip 120, a plurality of bonding wires 130, and a molding compound 140. The lead frame 110 includes a die pad 112 and a plurality of leads 114 surrounding the die pad 112.

The chip 120 includes an active surface 122 and a back surface 124 opposite to the active surface. The chip 120 is disposed on the die pad 112, and the back surface 124 of the chip 120 faces the die pad 112. The active surface 122 includes a plurality of contacts 126, and the bonding wires 130 electrically connects the contacts 126 to the leads 114. The molding compound 140 encapsulates the die pad 112, the leads 114, the chip 120, and the bonding wires 130, so as to prevent the chip 120 from being adversely affected by external moisture, heat, and noises. Further, the bonding wires 130 can also be protected from external damage.

In a conventional chip packaging process, the molding compound is formed by providing a semi-solid molding compound material e.g. epoxy resin at high temperature. Next, the molding compound material is molded and cooled, such that the molding compound is formed on the lead frame and encapsulates the chip. However, the impact arisen from an injection of the molding compound material may force the leads to wobble or shift, and thereby the adjacent leads are likely to be electrically connected to each other. Moreover, the production yield of the chip package structure is reduced as well.

SUMMARY OF THE INVENTION

The present invention provides a chip package structure and a method of fabricating the same. With use of a structure enhancement element during a chip packaging process, the distance between every two leads of a lead frame and the distance between the leads and a die pad are maintained. Thereby, the wobble or the shift of the die pad or of the leads due to an injection of the molding compound material according to the related art is reduced, and thus the production yield of the chip package structure is increased.

The present invention provides a chip package structure including a chip, a lead frame, a plurality of bonding wires, an upper encapsulant and a first lower encapsulant. The chip has an active surface, a back surface, and a plurality of chip bonding pads disposed on the active surface. The lead frame having an upper surface and a lower surface corresponding to the upper surface includes a die pad and a plurality of leads. The back surface of the chip is adhered to the die pad, and the leads surround the die pad. The bonding wires are electrically connected to the chip bonding pads and to the leads, respectively. The upper encapsulant encapsulates the chip, the bonding wires, and the upper surface of the lead frame. The first lower encapsulant encapsulating the lower surface of the lead frame has at least a concave to expose the corresponding upper encapsulant filled either between the die pad and one of the leads or between two of the adjacent leads.

According to one embodiment of the present invention, the chip package structure further includes a second lower encapsulant filled in the concave of the first lower encapsulant.

The present invention further provides a chip package structure including a chip, a lead frame, a plurality of bonding wires, an upper encapsulant and a lower encapsulant. The chip has an active surface, a back surface, and a plurality of chip bonding pads disposed on the active surface. The lead frame having an upper surface and a lower surface corresponding to the upper surface includes a die pad and a plurality of leads. The back surface of the chip is adhered to the die pad, and the leads surround the die pad. The bonding wires are electrically connected to the chip bonding pads and to the leads, respectively. The upper encapsulant encapsulates the chip, the bonding wires, and the upper surface of the lead frame. The lower encapsulant is filled between the die pad and the leads.

According to one embodiment of the present invention, the chip package structure further includes an etching mask disposed on the lower surface of the lead frame.

According to one embodiment of the present invention, the chip package structure further includes a lower encapsulant filled between the die pad and the etching mask.

According to one embodiment of the present invention, the lower encapsulant further encapsulates the etching mask.

According to one embodiment of the present invention, the chip package structure further includes an etching mask disposed on the lower surface of the leads.

According to one embodiment of the present invention, the chip package structure further includes a lower encapsulant filled between the die pad and the leads, and the lower surface of the die pad is exposed.

According to one embodiment of the present invention, the chip package structure further includes an etching mask disposed on the lower surface of the die pad.

According to one embodiment of the present invention, the chip package structure further includes a lower encapsulant filled between the die pad and the leads, and the lower surface of the leads is exposed.

According to one embodiment of the present invention, one of the die pad and the leads has a down-set design.

The present invention further provides a chip package structure including a chip, a lead frame, a plurality of bonding wires, an upper encapsulant and a lower encapsulant. The chip has an active surface, a back surface, and a plurality of chip bonding pads disposed on the active surface. The lead frame having an upper surface and a lower surface corresponding to the upper surface includes a die pad and a plurality of leads. The back surface of the chip is adhered to the die pad, and the leads surround the die pad. The bonding wires are electrically connected to the chip bonding pads and to the leads, respectively. The upper encapsulant encapsulates the chip, the bonding wires, and the upper surface of the lead frame. The lower encapsulant filled between the die pad and the leads encapsulates the lower surface of the lead frame.

The present invention further provides a method of fabricating a chip package structure. The method includes the following steps of first providing a lead frame having an upper surface and a lower surface. The lead frame includes a die pad, a plurality of leads surrounding the die pad, and at least a structure enhancement element connecting the die pad to one of the leads, or connecting two of the adjacent leads. Next, a chip is provided. The chip has an active surface, a back surface, and a plurality of chip bonding pads disposed on the active surface. Thereafter, the back surface of the chip is adhered to the die pad. Afterwards, a plurality of bonding wires is formed so as to electrically connect the chip bonding pads and the leads, respectively. Next, an upper encapsulant and a lower encapsulant are formed. The upper encapsulant encapsulates the upper surface of the lead frame, the chip and the bonding wires, while the lower encapsulant encapsulates the lower surface of the lead frame and has at least a concave so as to expose the structure enhancement element. Finally, the structure enhancement element is etched with use of the lower encapsulant as an etching mask until the die pad and one of the leads connected by the structure enhancement element, or two of the adjacent leads connected thereby are electrically insulated.

According to one embodiment of the present invention, the bonding wires are formed through a wire bonding technique.

According to one embodiment of the present invention, the method of fabricating the chip package structure further includes filling an encapsulant into the concave of the lower encapsulant.

The present invention further provides a method of fabricating a chip package structure. The method includes the following steps of first providing a lead frame having an upper surface and a lower surface. The lead frame includes a die pad, a plurality of leads surrounding the die pad, and at least a structure enhancement element connecting the die pad to one of the leads, or connecting two of the adjacent leads. Next, a chip is provided. The chip has an active surface, a back surface, and a plurality of chip bonding pads disposed on the active surface. Thereafter, the back surface of the chip is adhered to the die pad. Afterwards, a plurality of bonding wires is formed so as to electrically connect the chip bonding pads and the leads, respectively. Next, an upper encapsulant is formed. The upper encapsulant encapsulates the upper surface of the lead frame, the chip, and the bonding wires. An etching mask is then formed on the lower surface of the lead frame so as to expose the structure enhancement element. Eternally, the lead frame exposed by the etching mask is etched until the die pad and one of the leads connected by the structure enhancement element or two of the adjacent leads connected thereby are electrically insulated.

According to one embodiment of the present invention, the method of fabricating the chip package structure further includes forming a lower encapsulant filled between the die pad and the leads after the lead frame exposed by the etching mask is etched.

According to one embodiment of the present invention, the lower encapsulant is coplanar with the etching mask.

According to one embodiment of the present invention, the lower encapsulant further encapsulates the etching mask.

According to one embodiment of the present invention, the method of fabricating the chip package structure further includes removing the etching mask and then forming the lower encapsulant after the step of etching the metal thin plate is performed.

According to one embodiment of the present invention, the bonding wires are formed through a wire bonding technique.

According to one embodiment of the present invention, the etching mask is a patterned photoresist layer or a patterned solder mask layer.

The method of fabricating the chip package structure disclosed in the present invention includes first disposing the chip on the lead frame having at least one structure enhancement element and then forming the necessary bonding wires and the molding compound on the chip and on the lead frame. Finally, after said structure enhancement element is etched, the chip packaging process is completed. With use of the structure enhancement element during the chip packaging process, the distance between every two of the leads in the lead frame and the distance between one of the leads and the die pad are maintained. Thereby, the wobble or the shift of the die pad or of the leads due to an injection of the molding compound material according to the related art is reduced, and thus the production yield of the chip package structure is increased.

In order to make the aforementioned and other objects, features and advantages of the present invention more comprehensible, several embodiments accompanied with figures are described in detail below.

DESCRIPTION OF EMBODIMENTS

First Embodiment

FIGS. 3A through 3F are schematic cross-sectional views depicting a process of fabricating a chip package structure according to a first embodiment of the present invention.

Figure 3A:
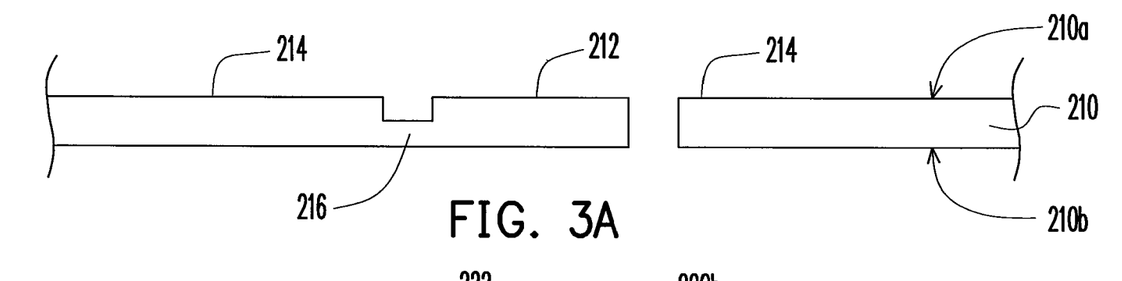
FIGS. 3A through 3F are schematic cross-sectional views depicting a process of fabricating a chip package structure according to a first embodiment of the present invention.

First, referring to FIG. 3A, a lead frame 210 having an upper surface 210a and a lower surface 210b is provided. The lead frame 210 includes a die pad 212, a plurality of leads 214 and a structure enhancement element 216 connecting the die pad 212 to one of the leads 214, such that the structure strength of the whole lead frame 210 is improved, and the wobble or the shift of the die pad 212 or of the leads 214 does not occur during an injection of the molding compound material. The die pad 212 is located around a central position of the lead frame 210, and the leads 214 surround the die pad 212. In the present embodiment, the lead frame 210 may be formed by a copper foil. The die pad 212, the leads 214 and the structure enhancement element 216 may be integrated as a whole. In addition, only one structure enhancement element 216 between the leads 214 and the die pad 212 is depicted to demonstrate the present embodiment. However, a plurality of the structure enhancement elements may be disposed between the die pad and the leads or between two of the adjacent leads based on different demands, such that the structure strength of the lead frame 210 is enhanced. The position and the number of the structure enhancement element 216 are not limited in the present invention.

Figure 3B:
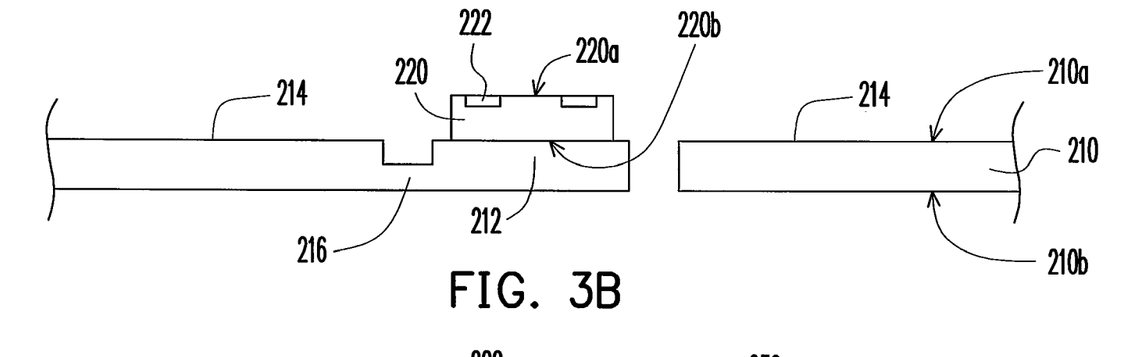

Next, referring to FIG. 3B, a chip 220 having an active surface 220a, a back surface 220b, and a plurality of chip bonding pads 222 is provided. Here, the active surface 220a is opposite to the back surface 220b, and the chip bonding pads 222 are disposed on the active surface 220a of the chip 220. The back surface 220b of the chip 220 is adhered to the die pad 212 of the lead frame 210. For example, the chip 220 may be adhered to the die pad 212 via an adhesive. Thereafter, referring to FIG. 3C, a plurality of bonding wires 230 is formed. The bonding wires 230 are electrically connected to the chip bonding pads 222 and the leads 214, respectively, and thereby the chip 220 may be electrically connected to the lead frame 210 through the bonding wires 230. The bonding wires 230 are formed through a wire bonding technique.

Figure 3C:
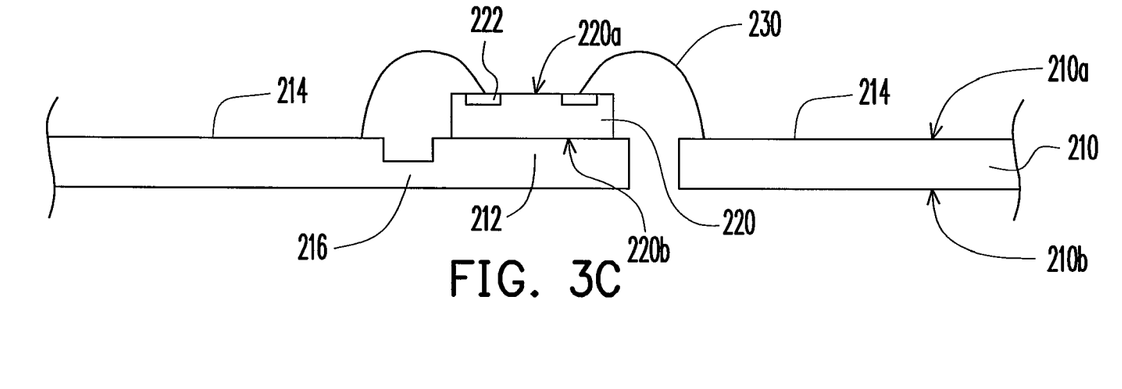
Figure 3D:
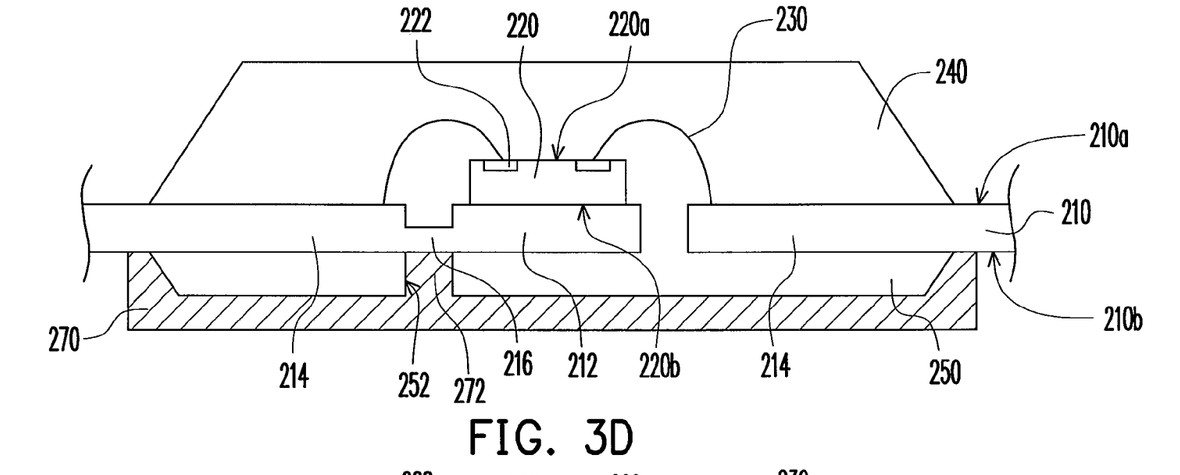

Afterwards, referring to FIG. 3D, an upper encapsulant 240 and a first lower encapsulant 250 are formed on the upper surface 210a and the lower surface 210b of the lead frame 210, respectively. The upper encapsulant 240 encapsulates a portion of the upper surface 210a of the lead frame 210, the chip 220, and the bonding wires 230. The first lower encapsulant 250 encapsulates the lower surface 210b of the lead frame 210 and has a concave 252 disposed corresponding to the position of the structure enhancement element 216, such that the structure enhancement element 216 on the lead frame 210 is exposed. The concave 252 of the first lower encapsulant 250 may be formed through constructing a corresponding protrusion part 272 of a mold 270 required in the process of forming the first lower encapsulant 250. Since the lead frame 210 of the present invention includes the structure enhancement element 216 connected the die pad 212 to the leads 214, the wobble or the shift of the die pad 212 or of the leads 214 in the lead frame 210 due to an injection of the molding compound material is reduced when the upper encapsulant 240 and the first lower encapsulant 250 are formed. Further, the production yield of the chip package structure 200 is increased.

Figure 3E:
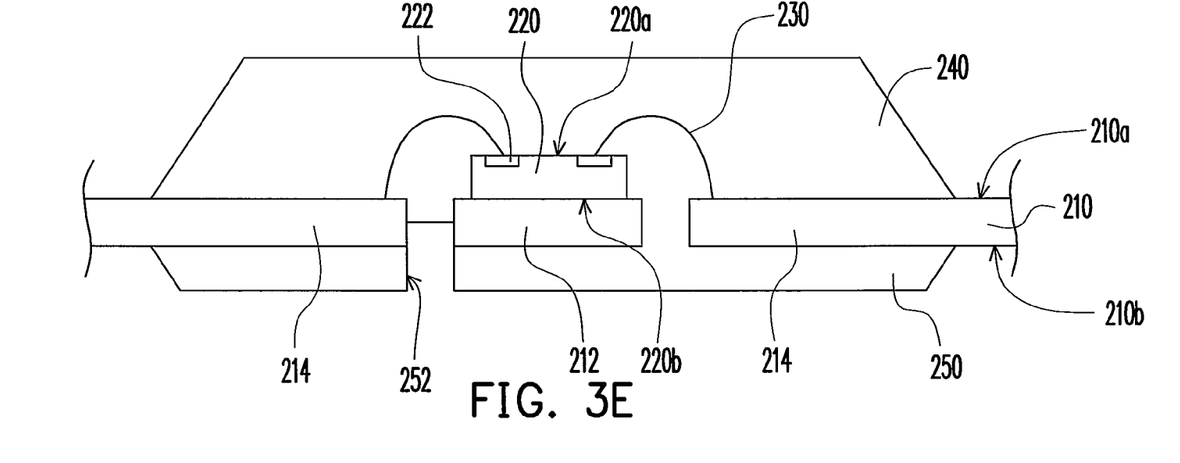

Finally, referring to FIG. 3E, the structure enhancement element 216 of the lead frame 210 is etched with use of the first lower encapsulant 250 as an etching mask until the die pad 212 and one of the leads 214 are electrically insulated. If the structure enhancement element 216 is disposed between two of the adjacent leads 214, the structure enhancement element 216 is etched until two of the adjacent leads 214 connected by the structure enhancement element 216 are electrically insulated. Up to here, the process of fabricating the chip package structure 200 is completed.

According to the lead frame 210 of the chip package structure 200 in the present embodiment, the structure enhancement element 216 is disposed between two of the adjacent leads 214 and/or between one of the leads 214 and the die pad 212. Hence, the deformation of the lead frame 210 and a short circuit are not likely to occur when the upper encapsulant 240 and the first lower encapsulant 250 are formed, and the production yield is further increased.

Figure 3F:
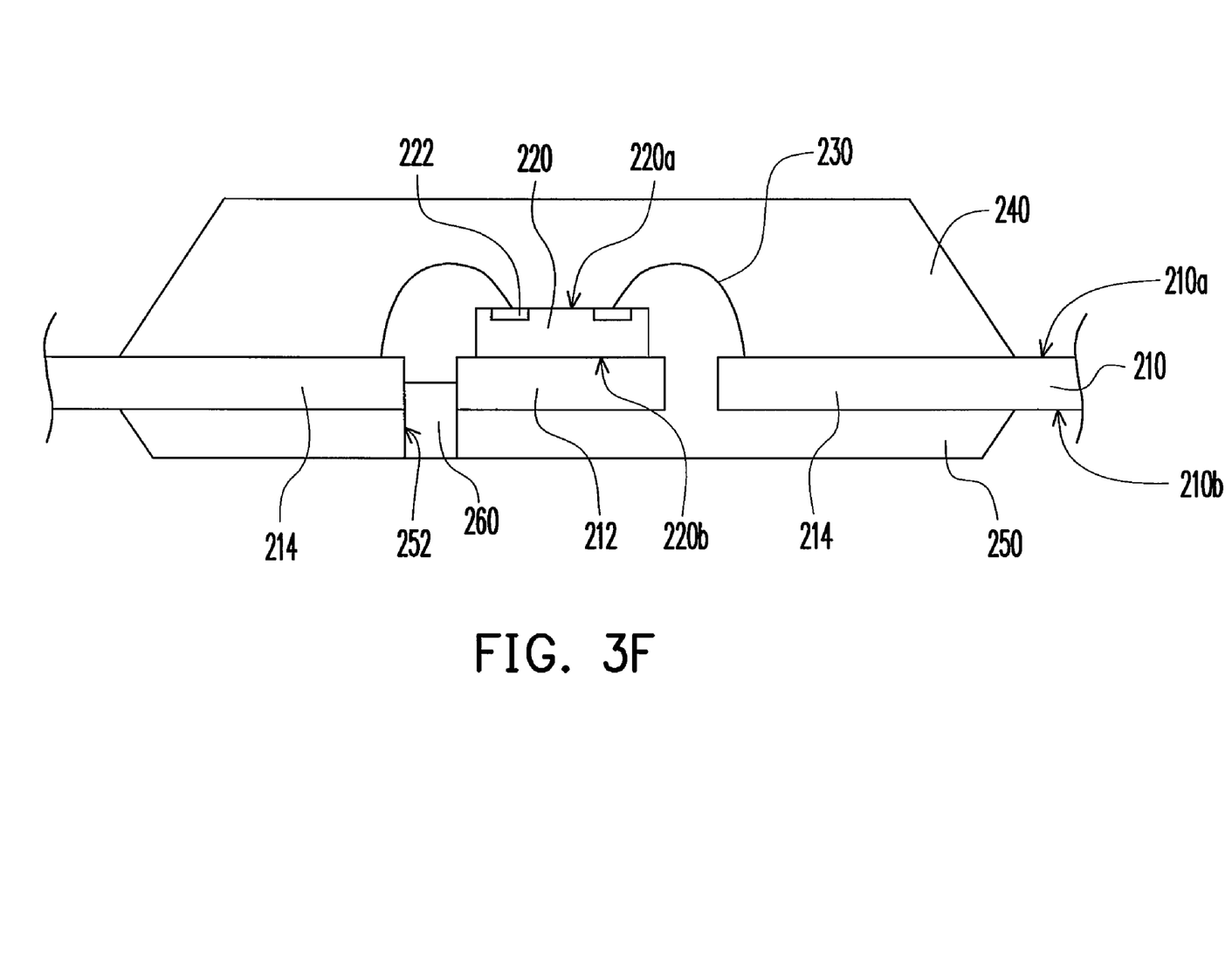

To prevent the die pad 212 and the leads 214 in FIG. 3E from being exposed to the air and oxidized, referring to FIG. 3F, a second lower encapsulant 260 may be formed in the concave 252 of the first lower encapsulant 250 after the step depicted in FIG. 3E is completed. Thereby, said oxidation can be avoided.

Second Embodiment

Figure 4A:
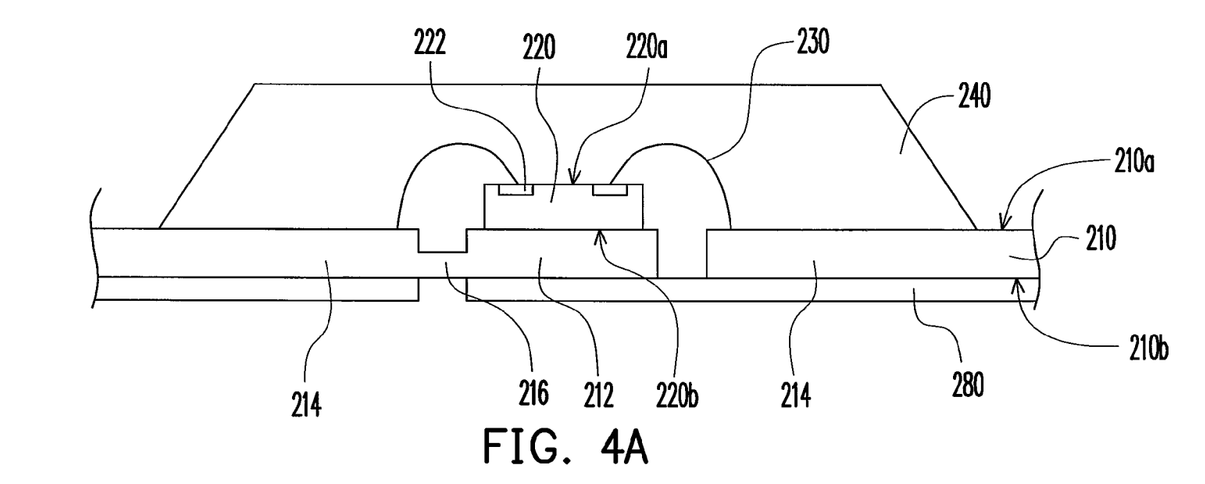
FIGS. 4A through 4C are schematic cross-sectional views depicting a partial process of fabricating a chip package structure according to a second embodiment of the present invention.

First, the processes illustrated in FIGS. 3A through 3C are performed. Since said processes are already elaborated in the first embodiment, no further description is provided herein. Referring to FIG. 4A, after the process in FIG. 3C is finished, an upper encapsulant 240 is formed on an upper surface 210a of a lead frame 210, and an etching mask 280 is formed on a lower surface 210b thereof. The upper encapsulant 240 encapsulates a portion of the upper surface 210a of the lead frame 210, a chip 220, and a plurality of bonding wires 230, and the etching mask 280 exposes a structure enhancement element 216. Said etching mask 280 may be formed by a patterned photoresist layer.

Figure 4B:
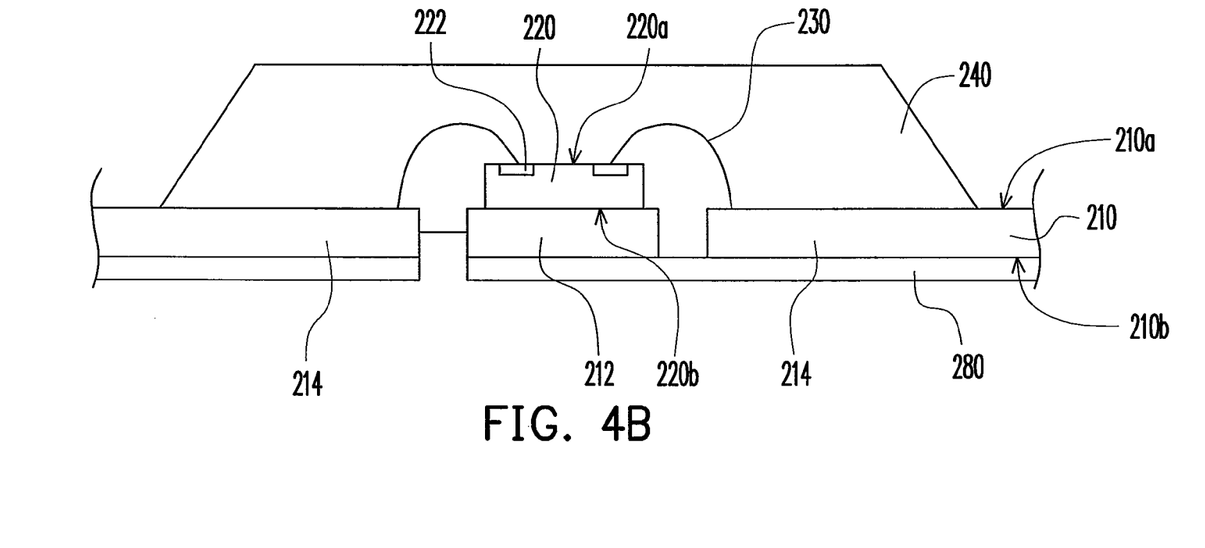

Next, referring to FIG. 4B, the structure enhancement element 216 of the lead frame 210 is etched until a die pad 212 and a plurality of leads 214 are electrically insulated. If the structure enhancement element 216 is disposed between two of the adjacent leads 214, the structure enhancement element 216 is etched until two of the adjacent leads 214 connected by the structure enhancement element 216 are electrically insulated.

Figure 4C:
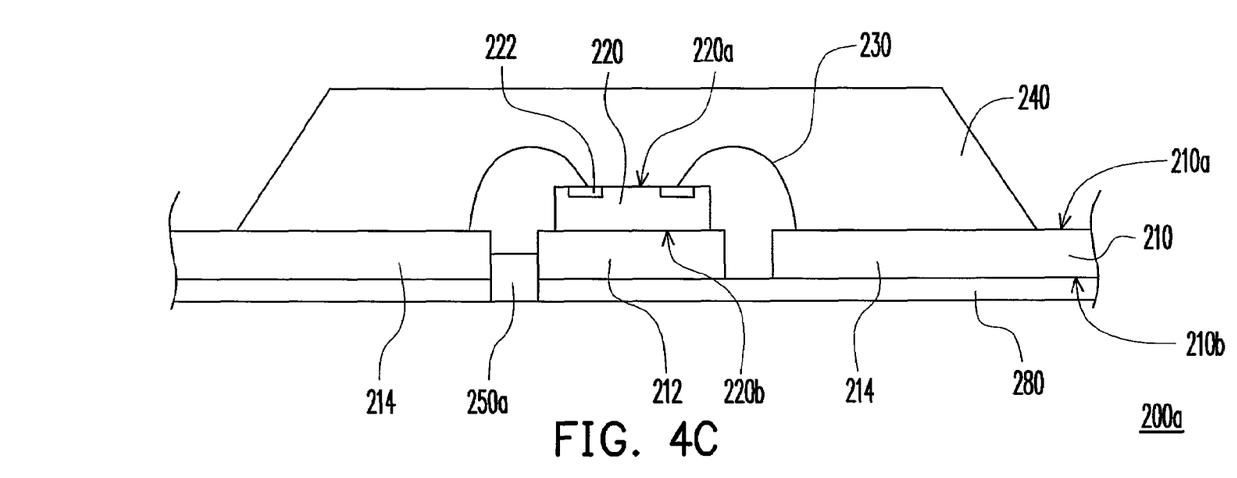

Likewise, to prevent the die pad 212 and the leads 214 from being oxidized due to exposure to the air, referring to FIG. 4C, a lower encapsulant 250a may be filled between the die pad 212 and the leads 214, and the fabrication of a chip package structure 200a is completed. Here, the lower encapsulant 250a may be coplanar with the etching mask 280.

Figure 5:
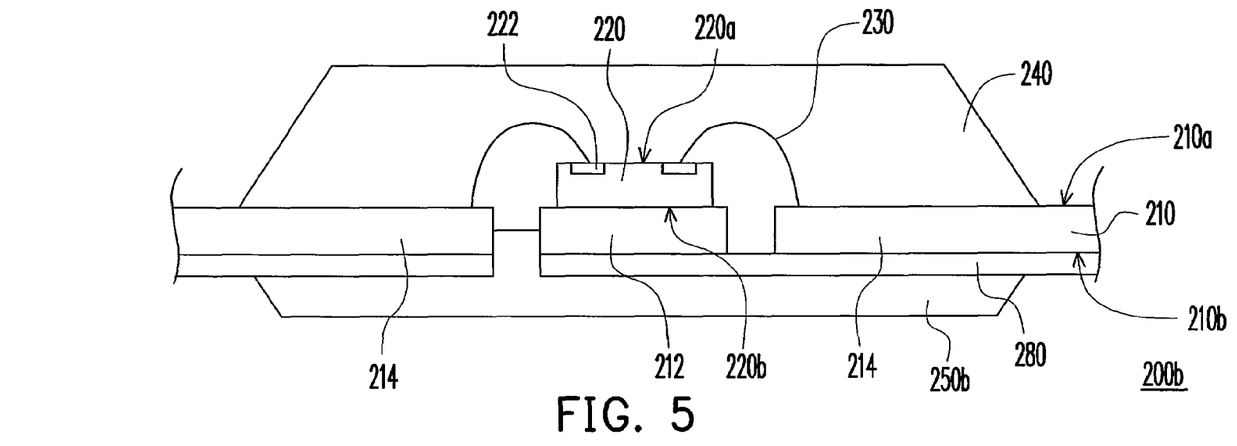
FIG. 5 is a schematic cross-sectional view depicting a chip package structure according to another embodiment of the present invention.

FIG. 5 is a schematic cross-sectional view depicting a chip package structure according to another embodiment of the present invention. Referring to FIG. 5, in the present embodiment, a lower encapsulant 250b of a chip package structure 200b not only is filled between a die pad 212 and a plurality of leads 214, but also encapsulates a lower surface 210b of a lead frame 210 and an etching mask 280.

Figure 6:
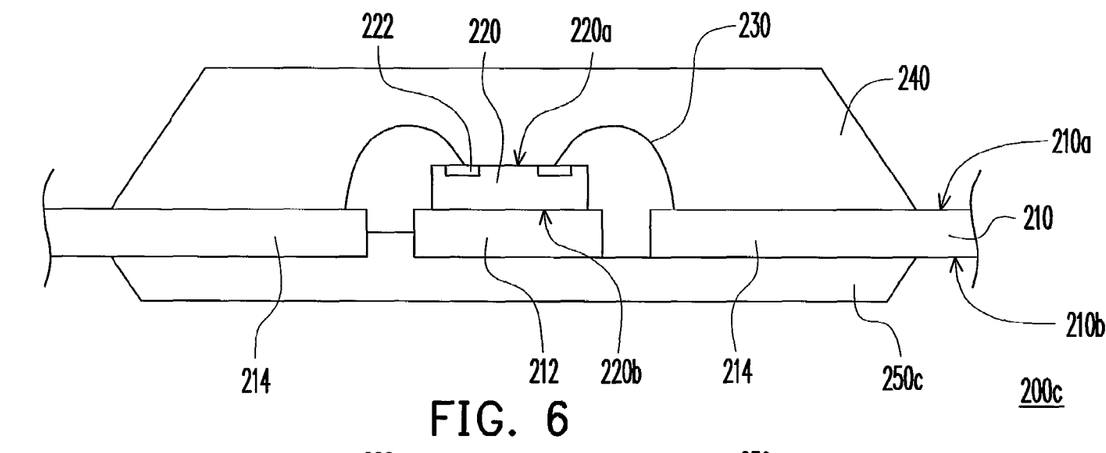
FIG. 6 is a schematic cross-sectional view depicting a chip package structure according to still another embodiment of the present invention.

FIG. 6 is a schematic cross-sectional view depicting a chip package structure according to still another embodiment of the present invention. Referring to FIG. 6, during the fabrication of a chip package structure 200c, an etching mask 280 may be firstly removed after a metal thin plate 210 is etched. A lower encapsulant 250c is then formed and encapsulates a lower surface 210b of the lead frame 210. Here, the method of removing the etching mask 280 includes, for example, dissolving the etching mask 280 with use of an organic solvent for a later removal.

Third Embodiment

Figure 7:
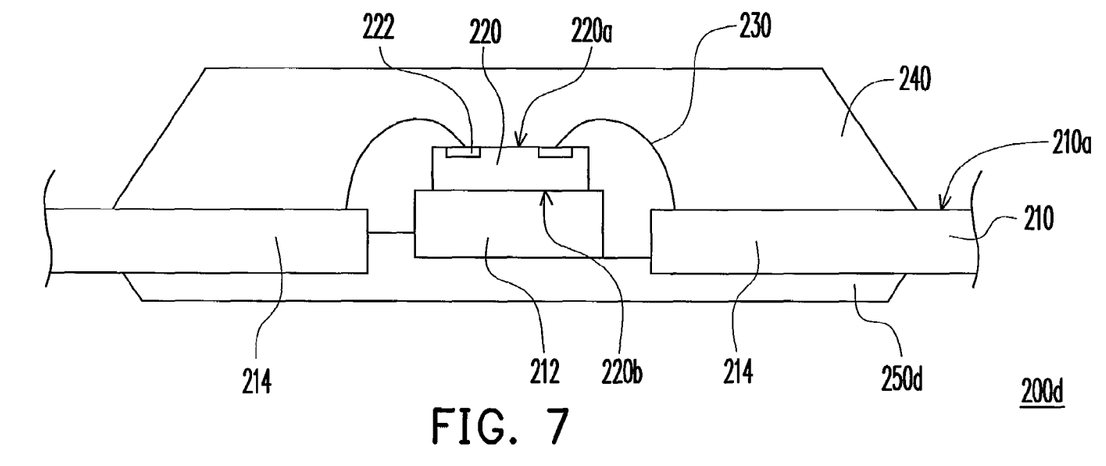
FIG. 7 is a schematic cross-sectional view depicting a chip package structure according to a third embodiment of the present invention.

Referring to FIG. 7, the difference between a third embodiment and the second embodiment lies in that a plurality of leads 214 of a lead frame 210 has a down-set design in a chip package structure 200d. That is to say, an upper surface of the leads 214 is lower than an upper surface of a die pad 212, so as to optimize mold-flow balance. Moreover, people skilled in the art may also enable the die pad 212 to have the down-set design, which is not limited in the present invention.

Fourth Embodiment

Figure 8:
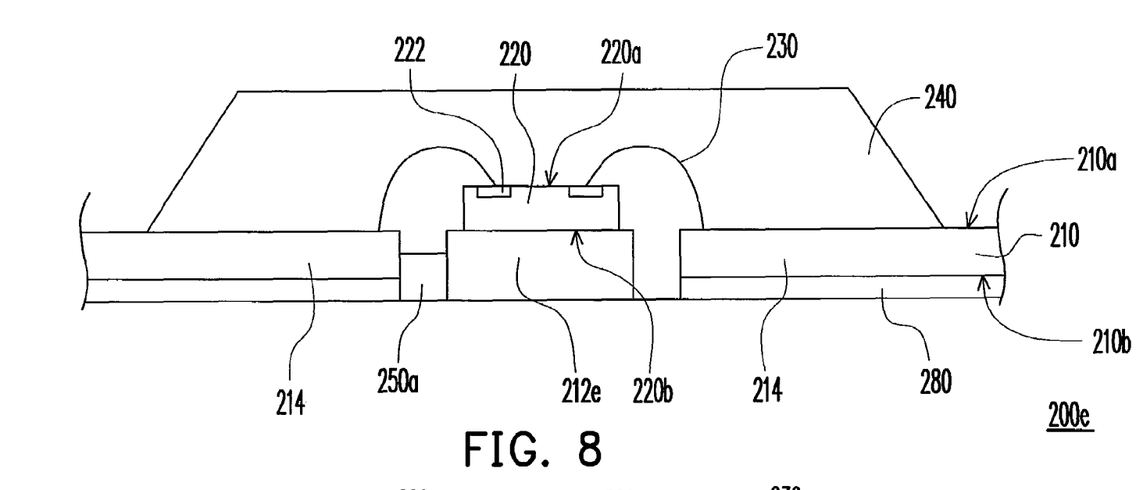
FIG. 8 is a schematic cross-sectional view depicting a chip package structure according to a fourth embodiment of the present invention.

FIG. 8 is a schematic cross-sectional view depicting a chip package structure according to a fourth embodiment of the present invention. Referring to FIG. 8, a chip package structure 200e is similar to the chip package structure 200a shown in FIG. 4C, while the difference between the fourth embodiment and the first embodiment lies in that an etching mask 280 is formed on a lower surface 210b of a plurality of leads 214, and the lower surface 210b of a die pad 212e is directly contacted to the external world, which may effectively improve the heat dissipation efficiency of the chip package structure 200e.

Figure 9:
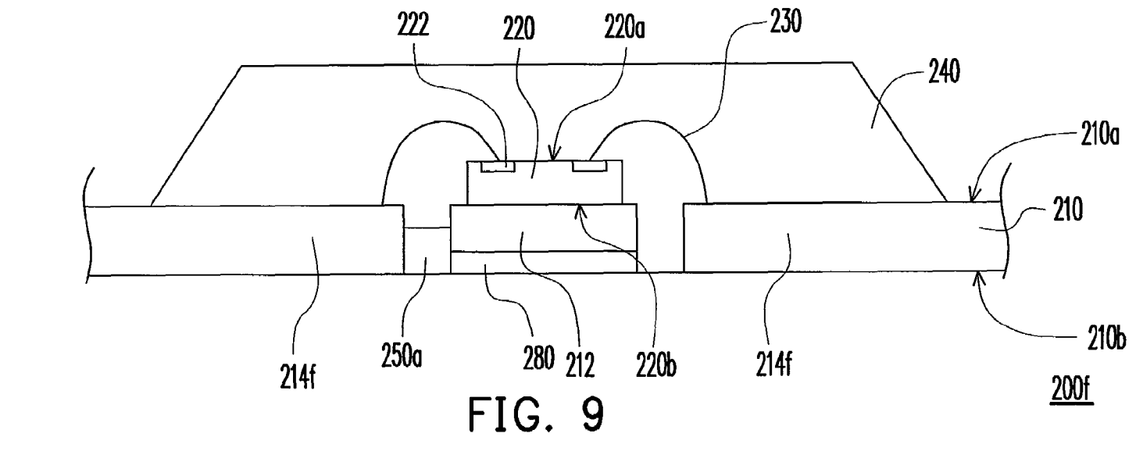
FIG. 9 is a schematic cross-sectional view depicting a chip package structure according to yet still another embodiment of the present invention.

Besides, the etching mask and a lower encapsulant may expose a lower surface of the leads as well. FIG. 9 is a schematic cross-sectional view depicting a chip package structure according to yet still another embodiment of the present invention. Referring to FIG. 9, in a lead frame 210 of a chip package structure 200f, an etching mask 280 and a lower encapsulant 350 expose a lower surface 210b of a plurality of leads 214f. Thereby, the chip package structure 200f may be applied to a package structure having no leads, such as a quad flat no-lead (QFN) package structure. Aside from the above, people skilled in the art may also enable the etching mask and the lower encapsulant to expose the lower surface of the other parts of the lead frame. For example, the lower surface of the leads and the lower surface of a die pad are simultaneously exposed by the etching mask and the lower encapsulant, which is not limited in the present invention.

In view of the foregoing, the chip package structure of the present invention employs the structure enhancement element to maintain the distance among the leads of the lead frame or the distance between the leads and the die pad during the chip packaging process. Thereby, the wobble or the shift of the die pad or of the leads due to the injection of the molding compound material is reduced, and thus the production yield of the chip package structure is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a chip having an active surface, a back surface, and a plurality of chip bonding pads disposed on the active surface;
   a lead frame having an upper surface and a lower surface corresponding to the upper surface, the lead frame comprising:
      a die pad to which the back surface of the chip is adhered; and
      a plurality of leads surrounding the die pad, wherein the die pad is separate from the plurality of the leads with at least one gap there-between;
   a photoresist layer partially covering the lower surface of the lead frame but having only one opening to expose one of the at least one gap;
   a plurality of bonding wires electrically connected to the plurality of the chip bonding pads and to the plurality of the leads, respectively;
   an upper encapsulant encapsulating the chip, the plurality of the bonding wires, and the upper surface of the lead frame; and
   a lower encapsulant filled only in the only one opening.

2. The chip package structure of claim 1, wherein a lower surface of the lower encapsulant is coplanar with that of the photoresist layer.

* * * * *